(12) United States Patent
Andry et al.

(10) Patent No.: US 7,936,060 B2
(45) Date of Patent: May 3, 2011

(54) REWORKABLE ELECTRONIC DEVICE ASSEMBLY AND METHOD

(75) Inventors: Paul S. Andry, Yorktown Heights, NY (US); Stephen L. Buchwalter, Anthem, AZ (US); George A. Katopis, Poughkeepsie, NY (US); John U. Knickerbocker, Yorktown Heights, NY (US); Stelios G. Tsapepas, Yorktown Heights, NY (US); Bucknell C. Webb, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/431,827

(22) Filed: Apr. 29, 2009

(65) Prior Publication Data

US 2010/0276796 A1  Nov. 4, 2010

(51) Int. Cl.
*H01L 23/52* (2006.01)
(52) U.S. Cl. ................ 257/691; 257/E21.499
(58) Field of Classification Search .......... 257/692, 257/E21.499, E23.171, E23.141; 174/255; 438/121
See application file for complete search history.

(56) References Cited

U.S. PATENT DOCUMENTS

| | | | |
|---|---|---|---|
| 6,333,563 B1 | 12/2001 | Jackson et al. | |
| 6,580,031 B2 * | 6/2003 | Chung | 174/525 |
| 6,819,001 B2 * | 11/2004 | Burdick et al. | 257/778 |
| 6,982,225 B2 | 1/2006 | Bohr | |
| 7,081,650 B2 | 7/2006 | Palanduz et al. | |
| 7,206,203 B2 | 4/2007 | Campbell et al. | |
| 2002/0013420 A1 | 1/2002 | Wang et al. | |
| 2003/0073770 A1 | 4/2003 | Klemarczyk et al. | |
| 2004/0110010 A1 | 6/2004 | Buchwalter et al. | |
| 2004/0155364 A1 | 8/2004 | Doba | |
| 2005/0171301 A1 | 8/2005 | Doba | |
| 2005/0250248 A1 | 11/2005 | Buchwalter et al. | |
| 2006/0014924 A1 | 1/2006 | Hanley et al. | |
| 2006/0214314 A1 | 9/2006 | Watanabe et al. | |
| 2007/0017658 A1 | 1/2007 | Lehman et al. | |

* cited by examiner

*Primary Examiner* — Roy K Potter
(74) *Attorney, Agent, or Firm* — Dennis Jung, Esq.; Kevin P. Radigan, Esq.; Heslin Rothenberg Farley & Mesiti P.C.

(57) ABSTRACT

An electronic device assembly is provided which includes a substrate, an interposer and an integrated circuit chip. The substrate is fabricated of a first material having a first thermal expansivity, and the interposer and integrated circuit chip are fabricated of a second material having a second thermal expansivity. The second thermal expansivity is different from the first thermal expansivity so that there is a coefficient of thermal expansion mismatch between the substrate and the interposer or chip. The interposer is coupled to the substrate via a first plurality of electrical contacts and an underfill adhesive at least partially surrounding the electrical contacts to bond the interposer to the substrate and thereby reduce strain on the first plurality of electrical contacts. The integrated circuit chip is coupled to the interposer via a second plurality of electrical contacts only, without use of an adhesive surrounding the second plurality of electrical contacts.

12 Claims, 8 Drawing Sheets

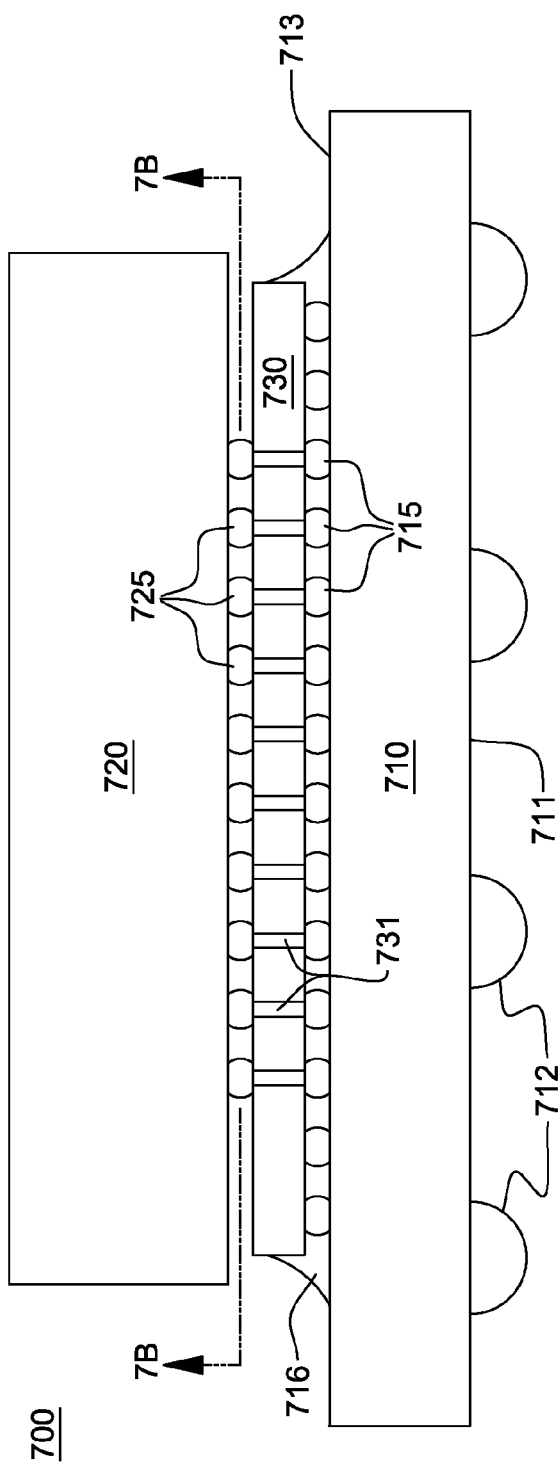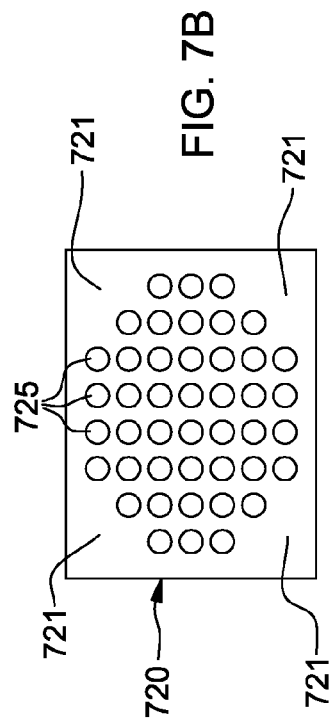

REWORKABLE ELECTRONIC DEVICE ASSEMBLY AND METHOD

TECHNICAL FIELD

The present invention relates in general to electronic device assemblies and methods of fabrication thereof, and more particularly, to reworkable electronic device assemblies and methods of fabrication thereof with an interposer interfacing an integrated circuit chip to a substrate, wherein there is a coefficient of thermal expansion mismatch between the integrated circuit chip and substrate.

BACKGROUND OF THE INVENTION

Flip chip technology has grown rapidly in recent years, since it allows a decreased chip footprint while simultaneously increasing the number of possible input/output contacts. This is because flip chip technology takes advantage of the entire chip area for input/output contacts, instead of just the chip periphery, as with wire-bonded integrated circuit chips. Various techniques exist for solder bumping wafers, such as evaporation, plating, solder paste screening, and more recently, injection-molded solder (IMS).

Typically, bumped wafers are diced in a next step into separate chips. For direct chip attach (DCA), silicon chips are bonded directly to a laminate substrate. DCA is a rapidly growing packaging technology since it requires a smallest amount of area on the laminate, has the highest height, and is lighter than other packages. Additionally, flip chip applications provide better electrical characteristics and better cooling than wire-bond package chips. However, since there is a significant coefficient of thermal expansion (CTE) mismatch between the integrated circuit chip, typically silicon-based, and the laminate material, such as an organic material, DCA bonded chips must conventionally be underfilled with an adhesive support material. Advantageously, this underfilling greatly increases the fatigue life of the solder bump connections between the integrated circuit chip and the laminate substrate.

One difficulty with this approach, however, is the lack of reworkability of the integrated circuit chip once adhesively bonded to the laminate substrate. Reworkability, particularly in multichip packaging, is a significant issue in making such packaging financially profitable. The underfill adhesive needed to address the coefficient of thermal expansion mismatch between a silicon-based integrated circuit chip and the supporting laminate substrate, prevents (or at least significantly inhibits) the ability to rework the integrated circuit chip assembly. Because of the underfill adhesive, such packaging does not lend itself readily to removal of the integrated circuit chip or to site cleaning of the individual contacts interconnecting the integrated circuit chip and substrate. This remains true notwithstanding the numerous attempts in the art to develop a reworkable underfill adhesive, principally due to the conflicting requirements and the different roles the underfill adhesive needs to perform imposes on the constituent materials.

SUMMARY OF THE INVENTION

The shortcomings of the prior art are overcome and additional advantages are provided through the provision, in one aspect, of an interposer substrate assembly which includes a substrate and an interposer coupled to the substrate. The substrate includes a first material having a first thermal expansivity and the interposer includes a second material having a second thermal expansivity. The second thermal expansivity is different from the first thermal expansivity and there is a coefficient of thermal expansion mismatch between the first and second materials. The interposer is coupled to the substrate via a first plurality of electrical contacts and an adhesive material at least partially surrounding the first plurality of electrical contacts. The adhesive material bonds the interposer to the substrate and reduces strain on the first plurality of electrical contacts resulting from the coefficient of thermal expansion mismatch between the first and second materials. The interposer facilitates coupling of an integrated circuit chip comprising the second material to the substrate by, in part, providing a smaller coefficient of a thermal expansion mismatch between the integrated circuit chip and the interposer compared with the integrated circuit chip and substrate.

In another aspect, an electronic device assembly is provided which includes a substrate, an integrated circuit chip and an interposer coupling the integrated circuit chip to the substrate. The substrate includes a first material having a first thermal expansivity, and the integrated circuit chip includes a second material having a second thermal expansivity. The second thermal expansivity is different from the first thermal expansivity such that there is a coefficient of thermal expansion mismatch between the substrate comprising the first material and the integrated circuit chip comprising the second material. The interposer, which also comprises the second material, is coupled to the substrate via a first plurality of electrical contacts and an adhesive material at least partially surrounding the first plurality of electrical contacts. The adhesive material bonds the interposer to the substrate and reduces strain on the first plurality of conductive contacts resulting from the coefficient of thermal expansion mismatch between the second material of the interposer and the first material of the substrate. The electronic device assembly further includes a second plurality of electrical contacts coupling the integrated circuit chip to the interposer without use of adhesive material at least partially surrounding the second plurality of electrical contacts.

In a further aspect, a method is provided for fabricating an electronic device assembly which includes: coupling an interposer to a substrate, the substrate comprising a first material having a first thermal expansivity, and the interposer comprising a second material having a second thermal expansivity, wherein the second thermal expansivity is different from the first thermal expansivity, and there is a coefficient of thermal expansion mismatch between the first material of the substrate and the second material of the interposer, and wherein the coupling includes providing a first plurality of electrical contacts and an adhesive material at least partially surrounding the first plurality of electrical contacts to couple the interposer to the substrate, the adhesive material bonding the interposer to the substrate and reducing strain on the first plurality of electrical contacts resulting from the coefficient of thermal expansion mismatch between the second material of the interposer and the first material of the substrate; and coupling an integrated circuit chip to the interposer using a second plurality of electrical contacts, wherein the integrated circuit chip is coupled to the interposer without use of an adhesive material at least partially surrounding the second plurality of electrical contacts, and wherein the integrated circuit chip comprises the second material having the second thermal conductivity, and the second plurality of electrical contacts have a lower reworking temperature than the first plurality of electrical contacts.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 7A is a cross-sectional elevational view of another embodiment of an electronic device assembly, in accordance with an aspect of the present invention;

FIG. 7B is a cross-sectional plan view of the electronic device assembly of FIG. 7A, taken along line 7B-7B, in accordance with an aspect of the present invention;

DETAILED DESCRIPTION OF THE INVENTION

Reworkability of integrated circuit chips in a multichip package is an important issue in making this form of packaging financially profitable. For many such packages, structural reliability of the integrated circuit chip(s) contacts to the substrate requires an underfill adhesive at least partially surrounding the conductive contacts electrically connecting the integrated circuit chip(s) to the substrate. In existing art, epoxy-based adhesive materials are most widely used as underfills. Epoxy resins are of significant importance for a number of diverse applications, including coatings, adhesives, structural materials, electrical insulations, encapsulates, etc. Epoxy formulations have outstanding properties after curing, including, but not limited to, toughness, adhesion and solvent resistance.

An attribute of epoxy thermosets is their intractability after curing. This intractability is an aspect of the chemistry of thermosets, which make use of a curing reaction to convert low molecular weight precursors to a polymer of essentially infinite molecular weight. This same property of intractability, however, can be a liability since it prohibits rework (or at least makes it very difficult). If expensive integrated circuit chips (or substrates) are to be used, the inability to rework the assembly may be unacceptable, since one defective part would render the whole assembly useless.

In underfills, thermosets act as adhesives, effectively gluing components to a substrate and encapsulating the electrical connections between the flip chip(s) and the substrate. Further, if a substrate holds more than one underfilled component, as in a high-performance MultiChip Module (MCM) or a Flip-Chip-On-Board (FCOB) application, the inability to disassemble or "rework" a defective underfilled component can become very expensive since the whole package becomes useless. Thus, a reworkable electronic device assembly and process for chips attached to a substrate is highly desirable.

Figure 1:
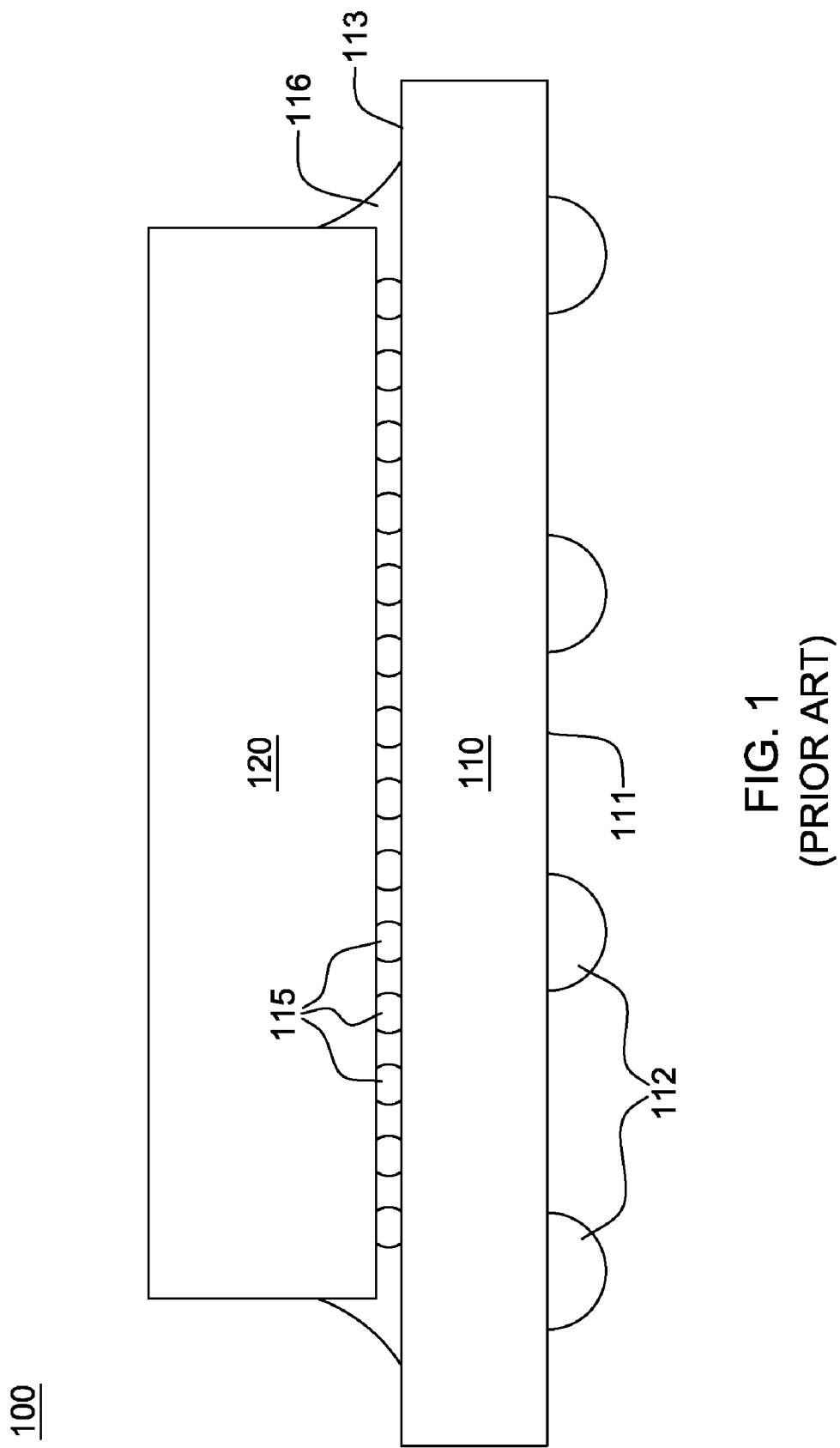
FIG. 1 a cross-sectional elevational view of one embodiment of a conventional electronic device assembly.

FIG. 1 depicts one embodiment of a conventional electronic device assembly, generally denoted 100. As shown, this assembly includes a substrate 110, which may comprise a first level package. Substrate 110 includes a first main surface 111 with a ball grid array (BGA) 112 disposed thereon. BGA 112 is used to electrically and mechanically connect substrate 110 to, for example, a card (not shown). The BGA commonly consists of an array of metal bumps or balls, which are soldered to connecting pads on both the substrate and the card. Conventionally, substrate 110 is a ceramic substrate, however, more recently, organic substrates have become popular.

An integrated circuit chip 120 is electrically and mechanically connected to a second main surface 113 of substrate 110 via a plurality of electrical contacts 115, such as a plurality of C4 interconnect bumps (or balls). An underfill adhesive 116 surrounds the plurality of electrical contacts 115 and comprises, for example, a high-modulus epoxy. Typically, the underfill adhesive fills the space between integrated circuit chip 120 and substrate 110, as well as the interstitial spaces between the plurality of electrical contacts 115. As noted, the result is an assembly which is conventionally not reworkable due to the intractability of the underfill adhesive.

Figure 2:
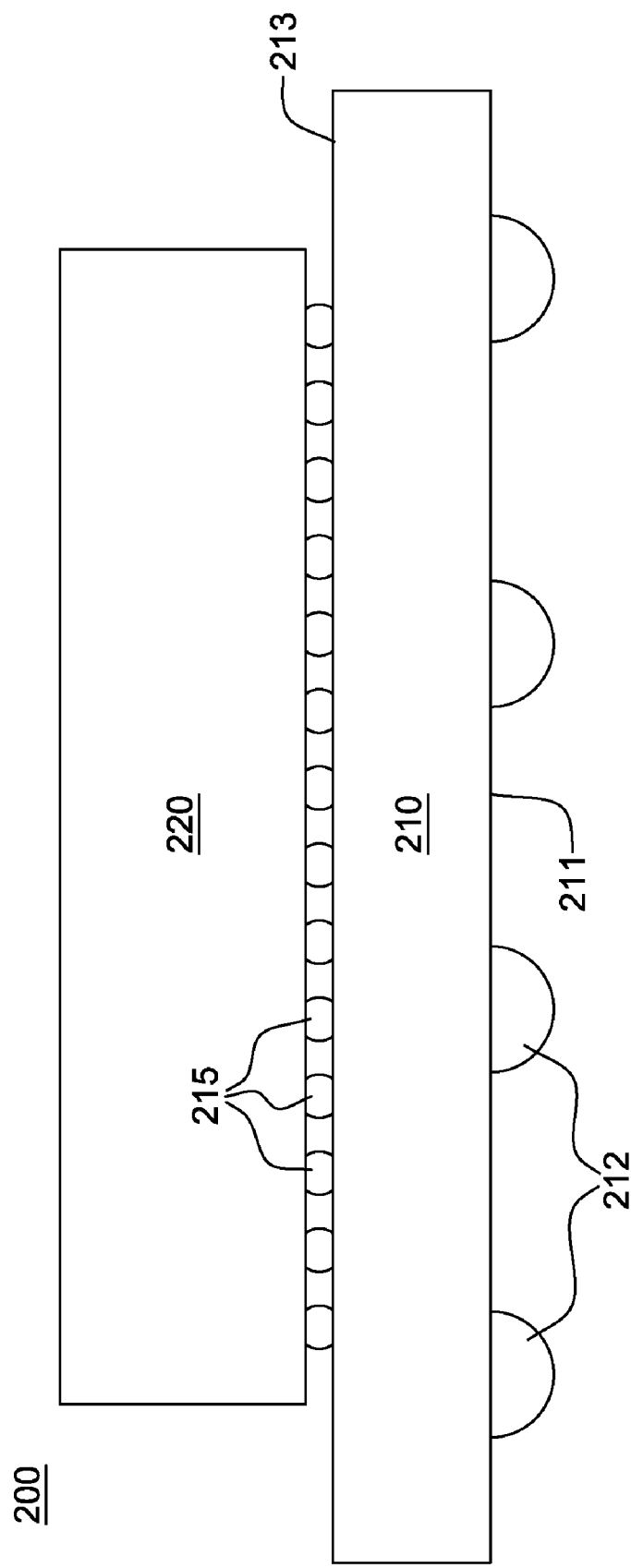
FIG. 2 is a cross-sectional elevational view of an alternate embodiment of an electronic device assembly.

FIG. 2 depicts an alternate embodiment of an electronic device assembly 200. As shown, electronic device assembly 200 includes a substrate 210, such as a first level organic or ceramic package, having a first main surface 211 with a ball grid array 212 disposed thereon, and a second main surface 213 electrically and mechanically coupled to integrated circuit chip 220 via, for example, a plurality of electrically contacts 215 only, such as a plurality of C4 contacts. This electronic device assembly is reworkable since there is no underfill adhesive between the integrated circuit chip and substrate. The disadvantage to the depicted assembly, however, is that strain on the plurality of electrical contacts interconnecting the integrated circuit chip and substrate becomes significant during operation of the chip, particularly at the electrical contacts farthest from the center of the chip, that is, at the corners of the chip.

During thermal cycling of the assembly, this high strain on the electrical contacts near the periphery of the chip can result in failure of the connections. This is particularly true in the case where the coefficient of thermal expansion (CTE) mismatch between the substrate and the integrated circuit chip is significant, as in the case of an organic package substrate and a semiconductor integrated circuit chip, such as a silicon chip. Without an underfill adhesive, reliability of the assembly isn't sufficient for commercial applications. For example, in modeling a conventional silicon integrated circuit chip of 720 micrometers thickness on today's standard organic package, a maximum plastic strain on the peripheral (and particularly, the corner connections), is 9.7% without underfill, assuming a thermal cycling from 25° C. to 100° C. This high strain is problematic to reliability of the depicted assembly.

Generally stated, proposed herein is an electronic device assembly and method of fabrication thereof which utilizes an interposer disposed between the integrated circuit chip and underlying substrate and a non-reworkable underfill adhesive coupling the interposer and substrate, with no underfill adhesive between the interposer and chip. Further, by selecting the interposer to comprise the same material as the integrated circuit chip (or a semiconductor material with a thermal expansivity matched to the integrated circuit chip material (e.g., silicon)), it is possible to provide a commercially viable, reworkable electronic device assembly, notwithstanding inclusion of a substrate and integrated circuit chip(s) having a significant CTE mismatch, such is the case with an organic substrate and a silicon chip. The assemblies disclosed herein advantageously protect a chip from thermal and mechanical stresses due to CTE mismatch between the chip and substrate, while still providing a capability of reworking the chip (or reworking the chips of a MCM).

In one embodiment, a relatively thin interposer, such as a 50-150 micrometers thick interposer, is provided having the same or a similar CTE as the chip(s) to be coupled to the substrate. This relatively thin interposer is adhesively bonded (for example, using conventional epoxy underfill) to the substrate, resulting in an interposer substrate assembly. The substrate may comprise any first level package, such as an organic or ceramic first level package. The interposer thickness is minimized to allow electrical vias to be formed therethrough using conventional technologies. These electrical vias serve to join a plurality of electrical contacts connecting the chip to the interposer to a plurality of electrical contacts connecting the interposer to the substrate. In one embodiment, the chip is coupled to the thin interposer using a plurality of electrical contacts comprising a low-melt C4, which allows subsequent thermal removal of the chip from the interposer substrate assembly if tests indicate that the chip is defective, thereby facilitating reworking of the assembly by allowing the coupling or bonding of another chip to the interposer substrate assembly. Note that in all embodiments described herein, it is assumed that the first plurality of electrical contacts have a higher reworking temperature than the second plurality of electrical contacts, thereby facilitating reworking of the integrated circuit chip, without affecting the underlying interposer substrate assembly. Further, note that the interposer described herein is assumed to be relatively inexpensive in comparison with the integrated circuit chip.

Figure 3:
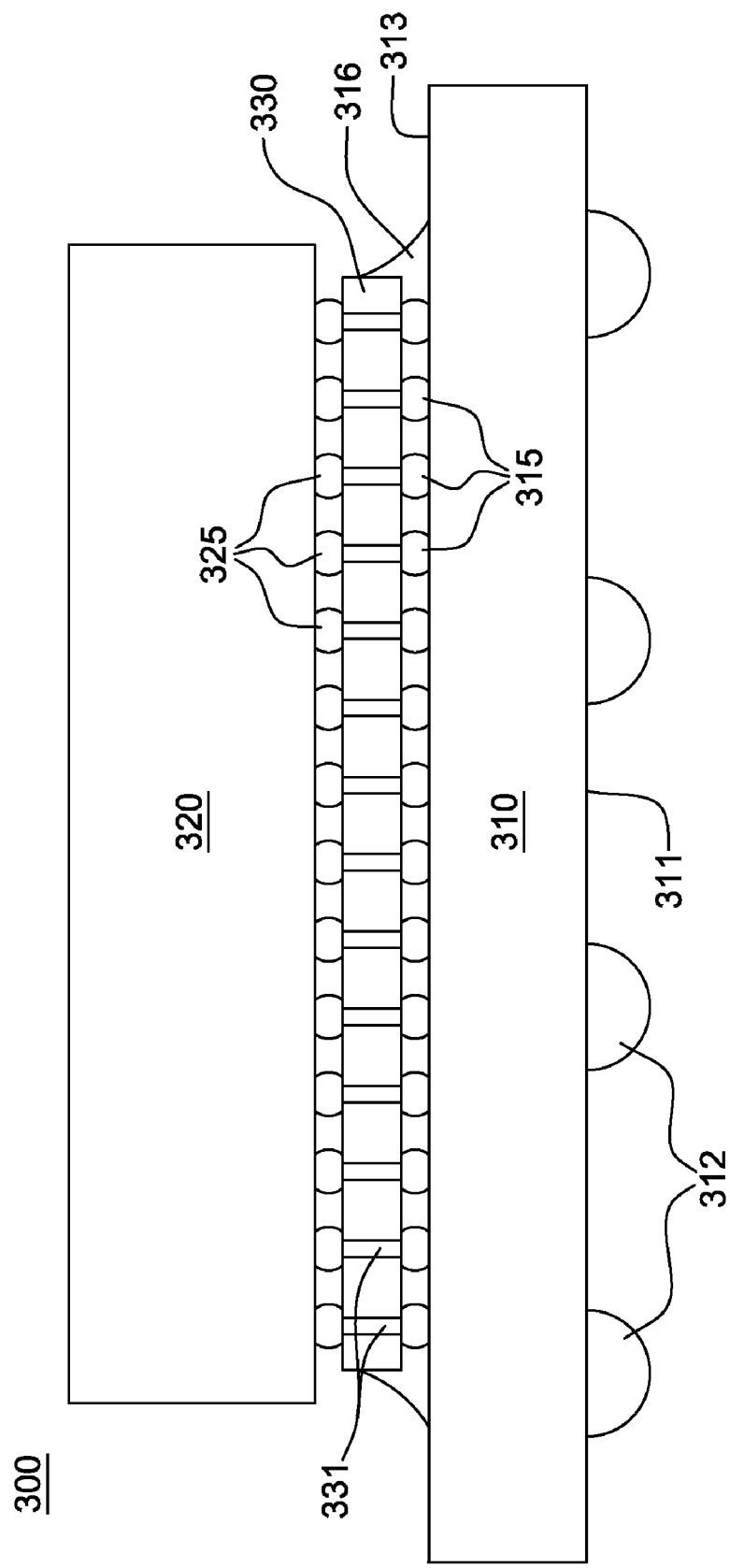
FIG. 3 is a cross-sectional elevational view of one embodiment of an electronic device assembly, in accordance with an aspect of the present invention.

FIG. 3 illustrates an embodiment of an electronic device assembly 300, in accordance with an aspect of the present invention. This electronic device assembly is reworkable since only a plurality of electrical contacts 325 couple integrated circuit chip 320 to the interposer substrate assembly comprising interposer 330 and substrate 310. In one embodiment, substrate 310 is a first level package, such as an organic package, with ball grid array contacts 312 on a first main surface 311 thereof. A first plurality of electrical contacts 315 couple interposer 330 to contacts (not shown) on a second main surface 313 of substrate 310. Underfill adhesive 316 is provided at least partially surrounding the first plurality of electrical contacts 315 to adhesively bond interposer 330 to substrate 310. This interposer substrate assembly becomes the "assembly" to which integrated circuit chip 320 is electrically and mechanically bonded by a second plurality of electrical contacts 325. By selecting interposer 330 to have a coefficient of thermal expansion the same as or similar to the coefficient of thermal expansion of integrated circuit chip 320, then the resulting electronic device assembly has an inherent stress reduction at the interposer-chip interface sufficient for the gap between the interposer and chip to not require underfill adhesive, while still providing a commercially viable electronic device assembly. This means that the integrated circuit chip is reworkable since only reworkable electrical contacts couple the chip to the interposer.

As illustrated, interposer 330 includes (in this embodiment) a plurality of electrical vias 331 extending through the interposer between its main surfaces. This plurality of electrical vias interconnect first plurality of electrical contacts 315 and second plurality of electrical contacts 325 as desired for a particular application.

Simulation modeling of electronic device assembly 300 of FIG. 3, assuming a 100 micron thick interposer, a conventional 720 micron thick chip, and thermal cycling from 25° C. to 100° C., illustrates a maximum plastic strain on the second plurality of electrical contacts 325 near the corners of the chip on the order of 2.2%, which is a reduction of 4.5× compared to the case for a standard first level organic package to chip interface without the interposer and underfill assembly of FIG. 3.

As a specific example, an ultra-thin silicon interposer or an interposer fabricated of another material having a similar CTE as the chip (such as a silicon chip or SiGe chip) may be manufactured on a wafer with a same footprint size as the target chip. Further, the ultra-thin interposer may be 50-150 microns thick. This facilitates creation of conventional electrical through vias, which are fabricated (in one embodiment) at the pitch of the electrical contacts (for example, C4 contacts) of the target chip on one main side and the pitch of the first level metal (that is, the electrical contacts on the substrate) on the other main side. These two pitches do not have to be the same, since the interposer is assumed to contain the required redistribution layers for connection of the chip's C4 terminals to the first level package pads (i.e., substrate pads). The interposer wafer is singulated and one of the resulting interposers is connected with high-melt C4 balls onto the first level package (i.e., the substrate). Electrical connectivity is checked, and if acceptable, the assembly is underfilled with standard, commercially available, non-reworkable underfill adhesive. Eutectic pads are formed on the top surface of the interposer (either before or after its attachment to the substrate) to provide bonding surfaces for the chip's C4 contacts. The chip, after being manufactured, wafer-tested and singulated, is bumped with low-melt C4 contacts and subsequently attached to the eutectic pads on the top of the interposer substrate assembly. Note again that lower-melt electrical contacts couple the chip to the interposer than the contacts coupling the interface to the substrate.

Note also that because the thickness of the interposer is so small, no signal or other electrical degradation is expected to the first order. In addition, because there is an appropriate CTE match between the chip and interposer, little thermal mechanical stresses are generated on the chip, while stresses generated on the interposer are ameliorated by the underfill adhesive bonding the interposer to the substrate. Because of the hierarchy of the solder between the chip and substrate, the chip can be readily thermally removed from the interposer by reworking the lower melt solder and the sites can be repaired to accept another chip. In any case, either the non-functional chip(s) can be removed or the functional chip(s) can be saved from the package. The course of action will depend on the average cost of the substrate and interposer. In either case, the interposer can be viewed as part of the underfill adhesive, with the additional capability of containing embedded passive components (such as decoupling capacitors, inductors or resistors). Advantageously, presented herein therefore is a hybrid assembly, wherein non-reworkable underfill adhesive bonds the interposer to the substrate with the solid, ultra-thin interposer having a CTE matched (or closely matched) to the integrated circuit chip. Thus, a substrate (such as an organic package with a CTE of 18-20) can be used with a silicon-based integrated circuit chip (with a CTE of 2-4), while still allowing for reworkability of the chip and minimization of stress on the electrical contacts connecting the chip to the interposer substrate assembly.

Figure 4:
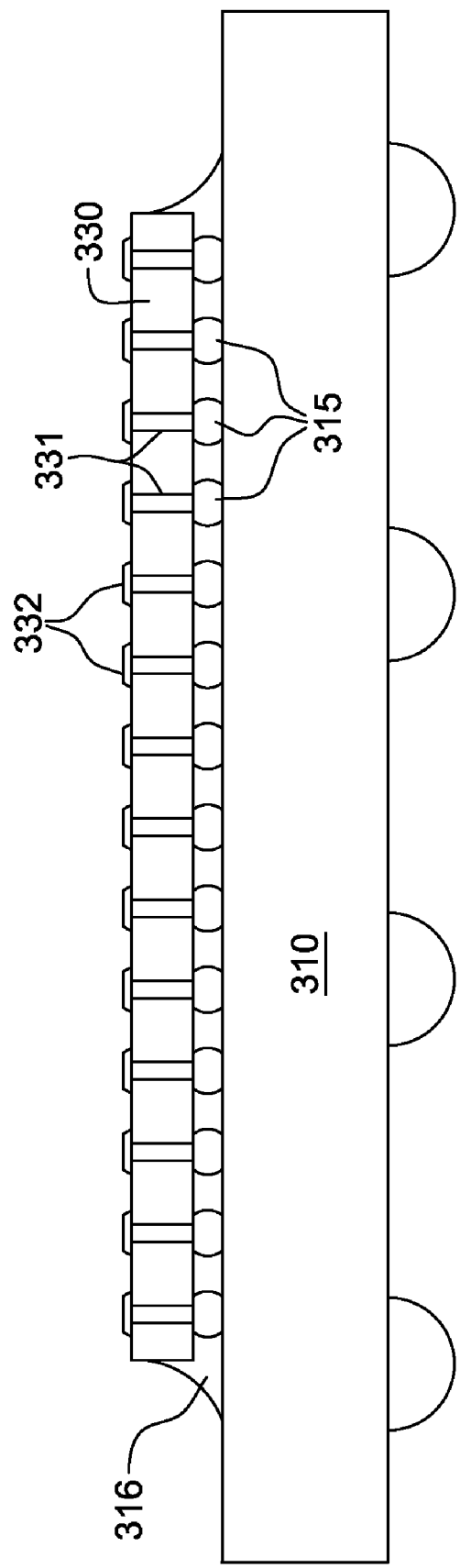
FIG. 4 is a cross-sectional elevational view of the electronic device assembly of FIG. 3, after reworking of electrical contacts to remove the integrated circuit chip, in accordance with an aspect of the present invention.

FIG. 4 illustrates the reworkable nature of the assembly, wherein the assembly's integrated circuit chip was tested and found to be defective. Thus, the integrated circuit chip has been removed and surface pads 322 on interposer 330 have been prepared for the joining of another chip to the interposer substrate assembly, which includes interposer 330 electrically and mechanically bonded to substrate 310 via a first plurality of electrical contacts 315 and underfill adhesive 316 at least partially surrounding the first plurality of electrical contacts.

Figure 5:
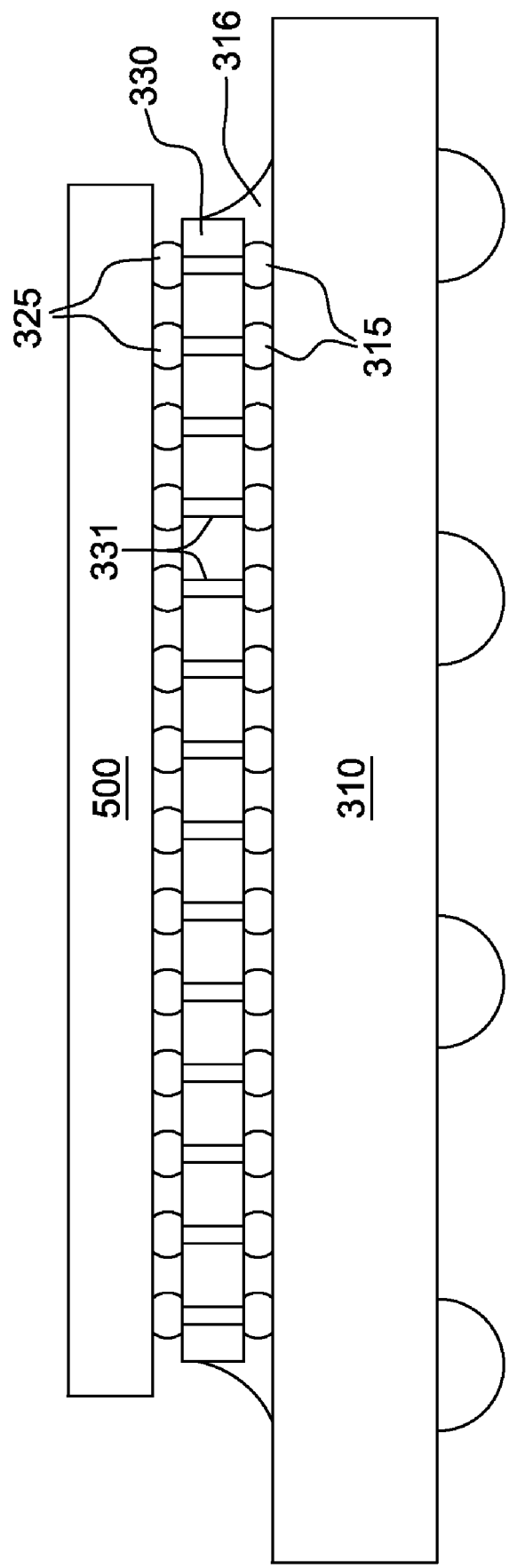
FIG. 5 is a cross-sectional elevational view of an alternate embodiment of an electronic device assembly comprising a thinned integrated circuit chip, in accordance with an aspect of the present invention.

FIG. 5 illustrates an alternate embodiment of an electronic device assembly, in accordance with an aspect of the present invention. In this embodiment, the interposer substrate assembly is similar to the interposer substrate assembly embodiment in the example of FIG. 4, and includes substrate 310 and interposer 330 electrically and mechanically interconnected together by first plurality of electrical contacts 315 and underfill adhesive 316 at least partially surrounding the electrical contacts. A ball grid array of contacts is illustrated on the underside of substrate 310 for facilitating electrical connection of the assembly to, for example, a printed circuit board (not illustrated). In this embodiment, the chip is a thinned integrated circuit chip 500. By way of example, the chip may be thinned to approximately 300 microns or less before being connected to the interposer substrate assembly via only a second plurality of electrical contacts 325. As illustrated, the second plurality of electrical contacts are connected by electrical through vias 331 to the first plurality of electrical contacts 315. Although illustrated as having the same pitch, the first plurality of electrical contacts and the second plurality of electrical contacts may have different pitches, with appropriate distribution layers being provided in the interposer. As in the embodiment of FIG. 4, the first plurality of electrical contacts are assumed to comprise a higher-melt material than the second plurality of electrical contacts, therefore allowing reworking of the second plurality of electrical contacts without effecting the underlying interposer substrate assembly.

As a specific example, the chip may be a thinned silicon chip, with the interposer being fabricated of silicon and the substrate being an organic package (or other material) having a significant CTE mismatch with silicon (e.g., a greater than 3× mismatch). The cost of thinning chip 500 is relatively inexpensive compared with the overall cost of the chip and assembly, and simulation of the resultant assembly shows a maximum plastic strain on the corner electrical contacts 325 on the order of 1.3%, which is a further reduction of about 2× compared with the case for a full thickness chip coupled to the interposer substrate assembly (such as depicted in FIG. 4). The simulation performed assumed a 300 micron thick chip, 100 micron thick interposer, and thermal cycling from 25° C. to 100° C.

Figure 6:
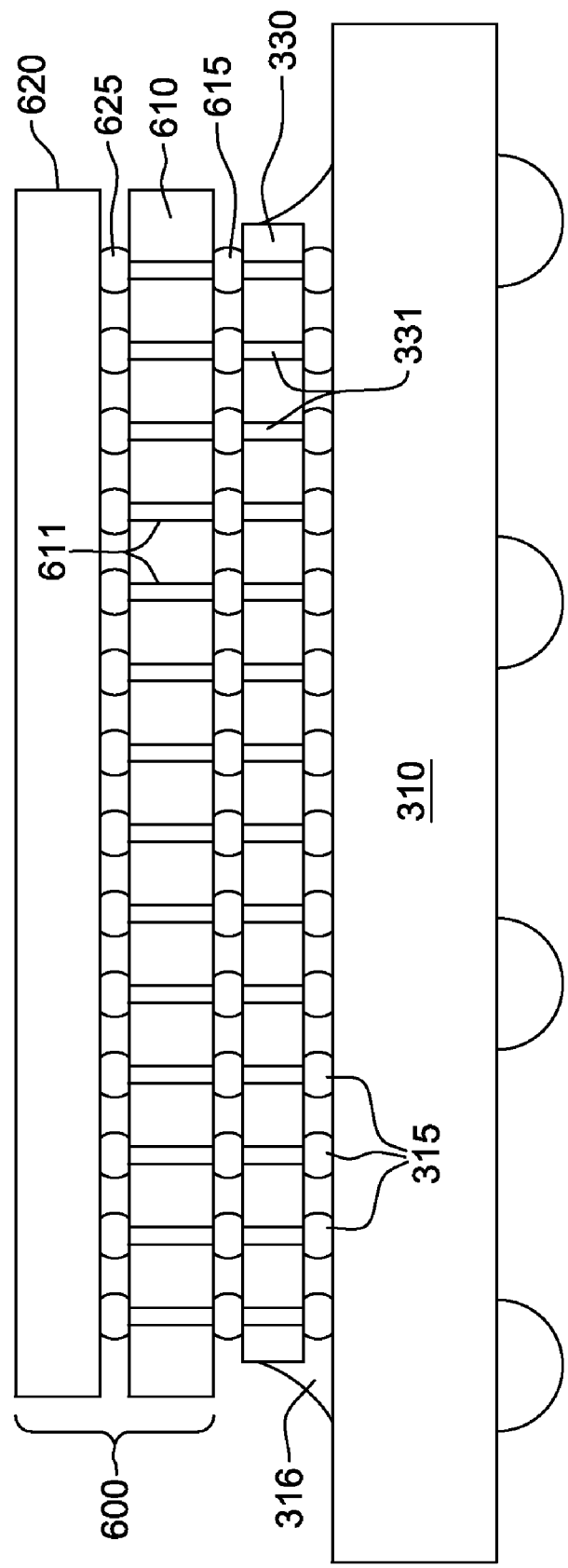
FIG. 6 is a cross-sectional elevational view of an another embodiment of an electronic device assembly comprising a stack of thinned integrated circuit chips, in accordance with an aspect of the present invention.

FIG. 6 illustrates another embodiment of an electronic device assembly (in accordance with an aspect of the present invention), wherein a stack 600 of thinned chips 610, 620 is provided over interposer 330 and substrate 310. In this approach, interposer 330 is electrically and mechanically coupled to substrate 310 via the first plurality of electrical contacts 315 and bonded thereto via underfill adhesive 316, as described above. First thinned chip 610 is electrically and mechanically coupled to interposer 330 via a second plurality of electrically contacts 615, and second thinned chip 620 is electrically and mechanically coupled to first thinned chip 610 via a third plurality of electrical contacts 625. Electrically conductive vias 611 are provided through first thinned chip 610, and electrically conductive vias 331 are provided through interposer 330 to allow for pass-through electrical connection of second thinned chip 620 to substrate 310, as required. By way of example, thinned chips 610 & 620 may comprise the same, homogeneous integrated circuit chips, such as the same memory chips, or may be heterogeneous chips, such as a processor chip 620 and a memory chip 610. By providing underfill adhesive 316 only between interposer 330 and substrate 310, the second thinned chip 620 and/or first thinned chip 610 may be reworked by heating the respective plurality of electrical contacts as needed to remove the chip(s). To facilitate this process, the first plurality of electrical contacts 315 can be fabricated to have a higher melt point than the second plurality of electrical contacts 615, which can be fabricated to have a higher melt point than the third plurality of electrical contacts 625. Alternatively, the second plurality of electrical contacts 615 may have the lowest melt point in order to facilitate removal and reworking of thinned chips 610, 620 together as a stack.

FIGS. 7A & 7B depict a further electronic device assembly 700 implementation, in accordance with an aspect of the present invention. In this implementation, reduced strain on the second plurality of electrical contacts 725 interconnecting chip 720 and interposer 730 is achieved by removing selected perimeter electrical contacts, for example, from the corners 721 of chip 720, as illustrated in FIG. 7B. In this embodiment, the interposer substrate assembly is similar to the interposer substrate assemblies described above, wherein interposer 730 and substrate 710 are electrically and mechanically connected via a first plurality of electrical contacts 715, and an underfill adhesive 716 at least partially surrounding the first plurality of electrical contacts. Substrate 710, which may comprise a first level organic package, includes a ball grid array 712 disposed on a first main surface 711 thereof opposite a second main surface 713 of substrate 710 having the electrical contact pads to which the first plurality of electrical contacts electrically connect. By selectively removing (for example, three) perimeter corner electrical contacts of the plurality of perimeter electrical contacts 725 (as illustrated in FIG. 7B), plastic strain on the remaining electrical contacts is reduced to 1.5% (i.e., assuming a 720 micron thick chip and 100 micron thick interposer). Thus, the full thickness of a conventional chip today (for example, 720 microns) may be employed while still achieving a 2% or less total strain on the electrical contacts interconnecting the chip to the interposer substrate assembly described herein.

Figure 8A:
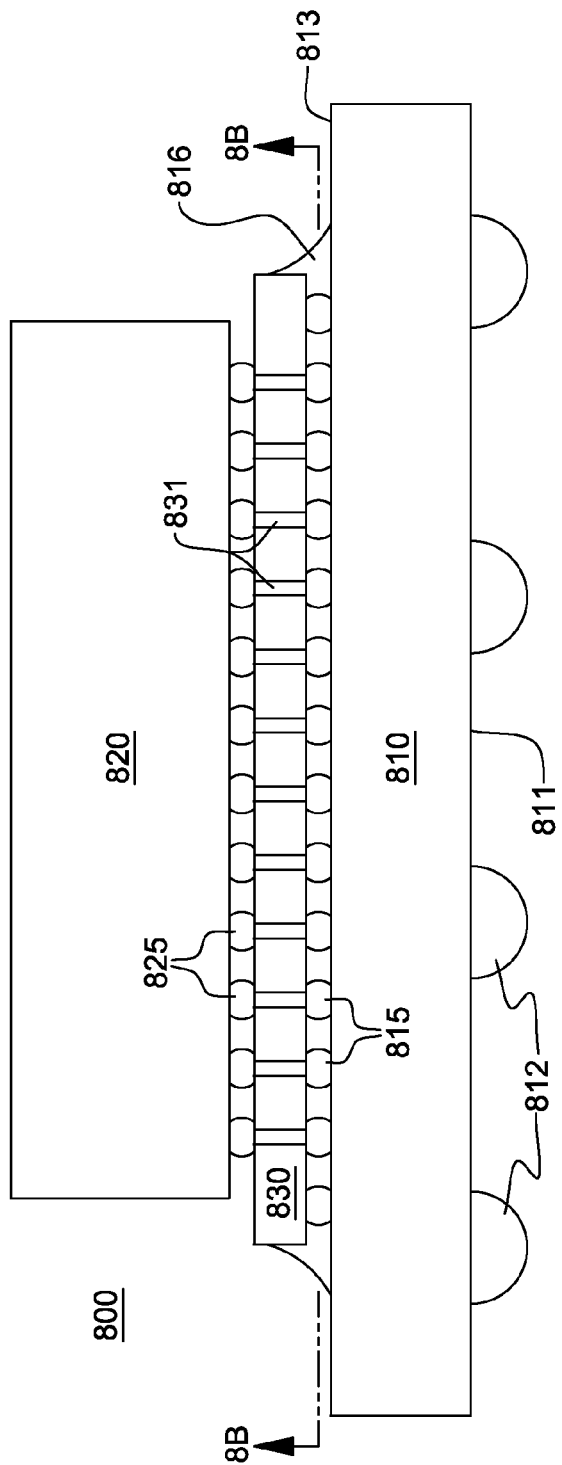
FIG. 8A is a cross-sectional elevational view of still another embodiment of an electronic device assembly, in accordance with an aspect of the present invention.
Figure 8B:
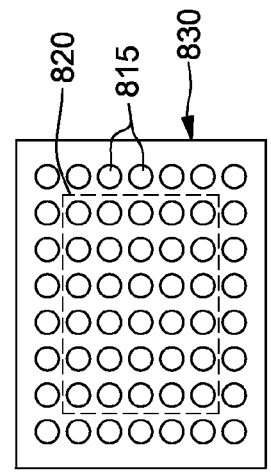
FIG. 8B is a cross-sectional plan view of the electronic device assembly of FIG. 8A, taken along line 8B-8B, and illustrating the larger footprint of the higher melt plurality of electrical contacts compared with the lower melt plurality of electrical contacts of this embodiment, in accordance with an aspect of the present invention.

FIGS. 8A & 8B depict a further embodiment of an electronic device assembly 800, in accordance with an aspect of the present invention. This embodiment includes a substrate 810, an interposer 830 and a chip 820. Chip 820 is assumed to comprise a conventional integrated circuit chip having today's thickness of, for example, 720 microns. Interposer 830 is electrically and mechanically connected to substrate 810 via a first plurality of electrical contacts 815 and underfill adhesive 816 at least partially surrounds the first plurality of electrical contacts and bonds interposer 830 to an upper main surface 813 of substrate 810. A lower main surface 811 of substrate 810 includes the above-described ball grid array 812 for, for example, coupling the assembly to a printed circuit board or other higher level packaging. A second plurality of electrical contacts 825 electrically and mechanically connect chip 820 to interposer 830. The first plurality of electrical contacts 815 are assumed to have a higher melt point (and therefore a higher rework temperature) than the second plurality of electrical contacts 825, which facilitates reworking of the assembly to remove chip 820, leaving intact the underlying interposer substrate assembly. Interposer 830 includes (in this embodiment) a plurality of electrically conductive vias 831 which electrically connect the second plurality of electrical contacts 825 to the first plurality of electrical contacts 815, as required. One or more distribution layers may be provided within the interposer to facilitate this interconnection.

As illustrated in FIGS. 8A & 8B, interposer 830 is fabricated with a larger cross-sectional area than the cross-sectional area of chip 820, and the first plurality of electrical contacts 815 comprise a larger footprint in plan view than the second plurality of electrical contacts 825 (as illustrated in FIG. 8B). As shown in this figure, at least one additional perimeter row of electrical contacts 815 is provided about the perimeter of the interposer to substrate connection, compared with the footprint of the second plurality of electrical contacts 825 electrically connecting chip 820 to interposer 830. This difference in footprint size reduces plastic strain on the corner bumps of the smaller footprint, second plurality of electrical contacts 825 coupling chip 820 to interposer 830.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An electronic device assembly comprising:
   a substrate, the substrate comprising a first material having a first thermal expansivity;
   an integrated circuit chip, the integrated circuit chip comprising a second material having a second thermal expansivity, the second thermal expansivity being different from the first thermal expansivity, wherein there is a coefficient of thermal expansion mismatch between the first material of the substrate and the second material of the integrated circuit chip;
   an interposer coupled to the substrate, the interposer comprising the second material having the second thermal expansivity, and being coupled to the substrate via a first plurality of electrical contacts and an adhesive material at least partially surrounding the first plurality of electrical contacts, the adhesive material bonding the interposer to the substrate and reducing strain on the first plurality of electrical contacts resulting from the coefficient of thermal expansion mismatch between the second material of the interposer and the first material of the substrate, wherein the interposer comprises a first thickness and the integrated circuit chip comprises a second thickness, the second thickness being greater than the first thickness;
   a second plurality of electrical contacts coupling the integrated circuit chip to the interposer without use of adhesive material at least partially surrounding the second plurality of electrical contacts, and wherein the second plurality of electrical contacts coupling the integrated circuit chip to the interposer without use of adhesive facilitates reworking of the electronic device assembly by facilitating removal of the integrated circuit chip from the interposer, the second plurality of electrical contacts being reworkable at a lower temperature than the first plurality of electrical contacts.

2. The electronic device assembly of claim 1, wherein the first thickness of the interposer is one third or less the second thickness of the integrated circuit chip.

3. The electronic device assembly of claim 1, wherein the interposer comprises electrically conductive vias extending from a first main surface to a second main surface thereof and electrically connecting at least some contacts of the second plurality of electrical contacts to at least some contacts of the first plurality of electrical contacts.

4. The electronic device assembly of claim 1, wherein the coefficient of thermal expansion mismatch between the first material and the second material is at least 3×.

5. The electronic device assembly of claim 4, wherein the integrated circuit chip is a thinned integrated circuit chip, and the second thickness of the integrated circuit chip is less than a conventional thickness of the integrated circuit chip and less than 5 times the first thickness of the interposer.

6. The electronic device assembly of claim 1, wherein the integrated circuit chip is a first, thinned integrated circuit chip, and wherein the electronic device assembly further comprises a second, thinned integrated circuit chip comprising the second material and coupled to the first, thinned integrated circuit chip via a third plurality of electrical contacts without use of adhesive material at least partially surrounding the third plurality of electrical contacts, the third plurality of electrical contacts being reworkable at a lower temperature than the first plurality of electrical contacts.

7. The electronic device assembly of claim 1, wherein the second plurality of electrical contacts comprise an array of conductive contacts, the array of conductive contacts comprising a plurality of perimeter contacts disposed closest to edges of the integrated circuit chip, and wherein multiple perimeter contacts adjacent to corners of the integrated circuit chip are absent from the array of conductive contacts to reduce strain on the array of conductive contacts.

8. The electronic device assembly of claim 1, wherein the first material is an organic material and the second material is a semiconductive material and the coefficient of thermal expansion mismatch is greater than 3×.

9. The electronic device assembly of claim 1, wherein the first plurality of electrical contacts are arrayed in a first footprint and the second plurality of electrical contacts are arrayed in a second footprint, the first footprint being larger than the second footprint.

10. The electronic device assembly of claim 9, wherein the interposer comprises a first planar cross-sectional area and the integrated circuit chip comprises a second planar cross-sectional area, the first planar cross-sectional area being larger than the second planar cross-sectional area, and wherein the first plurality of electrical contacts include a plurality of perimeter electrical contacts disposed outside the second planar cross-sectional area of the integrated circuit chip coupled to the interposer by the second plurality of electrical contacts.

11. The electronic device assembly of claim 1, wherein the first thickness of the interposer is in the range of 50-150 micrometers.

12. The electronic device assembly of claim 1, wherein the substrate comprises a first level organic package and the interposer comprises a semiconductive material, and wherein the interposer has a smaller planar cross-sectional area than the substrate, and the adhesive material comprises an underfill adhesive surrounding the first plurality of conductive contacts and bonding the interposer to the substrate at a first main surface of the substrate, and wherein the substrate further comprises an array of ball grid electrical contacts disposed on a second main surface thereof.

\* \* \* \* \*